(12) United States Patent
Pflum (10) Patent No.: US 7,817,674 B2
(45) Date of Patent: Oct. 19, 2010

(54) OUTPUT CLOCK ADJUSTMENT FOR A DIGITAL I/O BETWEEN PHYSICAL LAYER DEVICE AND MEDIA ACCESS CONTROLLER

(75) Inventor: Marty Pflum, Austin, TX (US)

(73) Assignee: Vitesse Semiconductor Corporation, Camarillo, CA (US)

(*) Notice: Subject to any disclaimer, the term of this patent is extended or adjusted under 35 U.S.C. 154(b) by 1089 days.

(21) Appl. No.: 10/754,204

(22) Filed: Jan. 9, 2004

(65) Prior Publication Data

US 2005/0152407 A1 Jul. 14, 2005

(51) Int. Cl.
H04L 7/00 (2006.01)
(52) U.S. Cl. .............. 370/508; 370/509; 370/516; 370/519; 375/354; 375/356
(58) Field of Classification Search ............... 370/508, 370/503, 509, 518; 375/326, 327, 354, 371, 375/356, 358
See application file for complete search history.

(56) References Cited

U.S. PATENT DOCUMENTS

| | | | |
|---|---|---|---|
| 3,908,084 A * | 9/1975 | Wiley | 375/373 |
| 4,415,984 A | 11/1983 | Gryger et al. | |
| 5,194,765 A | 3/1993 | Dunlop et al. | |
| 5,243,229 A | 9/1993 | Gabara et al. | |
| 5,298,800 A | 3/1994 | Dunlop et al. | |
| 5,737,589 A | 4/1998 | Doi et al. | |
| 5,870,594 A | 2/1999 | Doi et al. | |
| 5,955,894 A | 9/1999 | Vishwanthaiah et al. | |
| 6,047,021 A | 4/2000 | Grimes et al. | |
| 6,108,794 A | 8/2000 | Erickson | |
| 6,115,769 A * | 9/2000 | Anderson et al. | 710/305 |
| 6,127,862 A | 10/2000 | Kawasumi | |
| 6,175,258 B1 * | 1/2001 | Yim | 327/158 |
| 6,345,328 B1 | 2/2002 | Rozario et al. | |
| 6,380,758 B1 | 4/2002 | Hsu et al. | |

(Continued)

OTHER PUBLICATIONS

Gabara, Thaddeus J. & Knauer, Scott C.; "Digitally Adjustable Resistors in CMOS for High-Performance Applications"; IEEE Journal of Solid-State Circuits, Aug. 1992, pp. 1176-1185, vol. 27, No. 8.

Primary Examiner—Donald L Mills
Assistant Examiner—Mon Cheri S Davenport
(74) Attorney, Agent, or Firm—Klein, O'Neill & Singh, LLP (57) ABSTRACT

Output clock adjustment for a digital I/O between physical layer devices and media access controller. A method is disclosed for transferring data received on the input of a physical layer device from a transmission medium to an output associated with the physical layer device and to a media independent layer, the transferred data associated with transferred timing information from the physical layer device to the media independent layer. A receive clock is generated and then the data transitions in the received data are synchronized to at least one edge of the receive clock to provide synchronized receive data. The synchronized received data is then transmitted to the media independent layer. The generated receive clock is delayed by a predetermined clock delay to provide a delayed receive clock, and wherein the data transitions in the synchronized receive data is positioned relative to the rising edge of the delayed receive clock at a predetermined position therein following the rising edge thereof. The delayed receive clock transmitting with the transmitted synchronized receive data.

26 Claims, 4 Drawing Sheets

U.S. PATENT DOCUMENTS 6,535,057 B2 * 3/2003 Chakravarthy .............. 327/551
6,566,904 B2 5/2003 van Bavel et al.
7,043,893 B2 * 5/2006 Stalder et al. ................. 57/315
7,333,570 B2 * 2/2008 Aung et al. ................. 375/326

\* cited by examiner

OUTPUT CLOCK ADJUSTMENT FOR A DIGITAL I/O BETWEEN PHYSICAL LAYER DEVICE AND MEDIA ACCESS CONTROLLER

TECHNICAL FIELD OF THE INVENTION

The present invention pertains in general to transfer of data between Physical Layer Devices (PHY) and the Media Access Controller (MAC) and, more particularly, to the timing considerations for generation of the clock and the data transferred there between.

CROSS-REFERENCE TO RELATED APPLICATIONS

The present application is related to U.S. Pat. No. 6,604, 206, issued Aug. 5, 2003, which is incorporated herein by reference in its entirety.

BACKGROUND OF THE INVENTION

In high speed Ethernet controllers, such as gigabit Ethernet controllers, data is transferred at relatively high rates. In one instantiation, the driver/receiver circuitry for facilitating receipt of data from a network and transmission of data to a network for interface to the media side of the controller is contained within a Physical Layer Device (PHY) which is operable to interface with the Media Independent Interface (MII) side through a Media Access Controller (MAC) block. One side of the PHY connects to the physical media (transmission media), while the other side connects to the Media Independent Interface (MII)/Gigabit Media Independent Interface (GMII). Data is received by the PHY from the transmission medium and then transmitted to the MAC for a receive operation. During a transmit operation, data is transferred from the MAC to the PHY and the PHY then transmits the data onto the transmission medium. Each of the MAC and PHY have independent clocks such that a data clock is always transmitted with the data (except for the 10/100 mode). Due to the high data rate in the gigabit controller, some timing compensation is required between chips to ensure that the clock and data are properly aligned at the receiving one of the PHY and MAC blocks. The reason for this is that the clock edge of the data clock in the transmitter is utilized to generate data and then is also utilized at the opposite end, the receive end, to sample the data (for the RGMII mode). To ensure that the sampling is done only during "data valid" windows, there is provided some delay at the transmit end to ensure that data is sampled correctly. One method of doing this is to provide a fixed delay for the data to ensure that the data is positioned relative to the rising edge of the receive clock to ensure that the "data valid" region is disposed within the period of the receive clock at the appropriate position for the purpose of sampling of the data. This requires that there be a separate delay for each data line between the PHY and the MAC at the PHY on the receive path associated therewith. For a typical Gigabit Media Independent Interface (GMII), there are provided ten interface lines for transmitting receive data along the receive path, eight for the actual receive data and two for the receive data error and data valid signals. In another type of interface, a Ten Bit Interface (TBI), there are provided ten bits of data transfer. The number of pins associated with the GMII interface can be reduced with a Reduced GMII (RGMII) interface that requires only five data bits to transfer data and control information. However, there will always be a receive clock transmitted from the PHY to the MAC for received data along with the data for any of the interfaces, such that reconstruction thereof at the MAC by sampling will require some delay to be incorporated, since the data is clocked from the rising edge of the receive clock, due to some timing issues. Further, for accurate sampling of all of the data, this delay must be tightly controlled.

SUMMARY OF THE INVENTION

The present invention disclosed and claimed herein, in one aspect thereof, comprises a method for transferring data received on the input of a physical layer device from a transmission medium to an output associated with the physical layer device and to a media independent layer, the transferred data associated with transferred timing information from the physical layer device to the media independent layer. A receive clock is generated and then the data transitions in the received data are synchronized to at least one edge of the receive clock to provide synchronized receive data. The synchronized received data is then transmitted to the media independent layer. The generated receive clock is delayed by a predetermined clock delay to provide a delayed receive clock, and wherein the data transitions in the synchronized receive data is positioned relative to the rising edge of the delayed receive clock at a predetermined position therein following the rising edge thereof. The delayed receive clock transmitting with the transmitted synchronized receive data.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
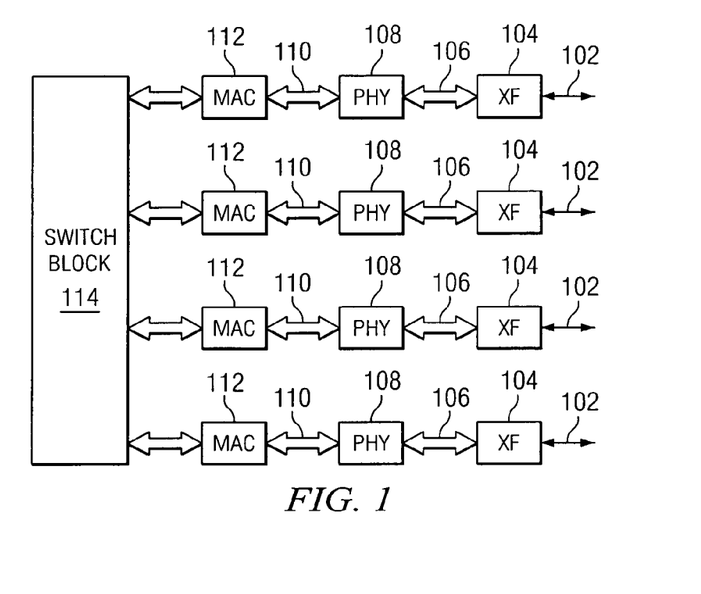
FIG. 1 illustrates an overall diagrammatic view of a switch utilizing the Ethernet controller of the present disclosure.

Referring now to FIG. 1, there is illustrated a diagrammatic view of an ethernet controller switch, this including a plurality of media input connections 102, all of which are interfaced with a transmission medium of, in the present embodiment, a twisted wire pair operating in a CAT5 environment, the media input connection 102 connected to another location, such as a remote station (not shown). Each of the media input connections 102 is interfaced with a transformer block 104, the transformer block 104 interfacing with a Media Dependent Interface (MDI) 106 to the input of a physical layer (PHY) block 108. The physical layer block 108 has contained therein various driver circuitry for driving the MDI 106 when data is transmitted, and for receiving from the transmission medium 102 through the MDI 106 with various receivers. The physical layer can condition this receive data and provide it as an output on a second Gigabit Media Independent Interface (GMII) 110 for delivery to the Media Access Controller (MAC) block 112.

The PHY 108 and MAC 112 are all associated with operation of an ethernet type controller. This system operates at three potential rates, 10 Mb/s, 100 Mb/s and 1000 Mb/s (gigabit) data rates. In the disclosed embodiment, this system operates on a twisted wire pair (and, therefore, they are referred to as the 10 BASE-T, 100 BASE-T and 1,000 BASE-T controllers). The PHY 108 is operable to receive the data in the appropriate format and then convert it to a format capable of being transmitted to the MAC 112. In the high speed operation, the 1000 BASE-T mode for Gigabit transmission rates, the PHY 106 utilizes full duplex baseband transmission over four pairs of category five (CAT5) balanced cabling or twisted wire. The aggregate data rate of 1000 Mb/s is achieved by transmission at a data rate of 250 Mb/s over each wire pair. The use of hybrids and cancellers enables full duplex transmission by allowing symbols to be transmitted and received on the same wire pairs at the same time. Baseband signaling with a modulation rate of 125 Mbaud is utilized on each of the wire pairs. The transmitted symbols are selected from a four-dimensional five-level symbol constellation. The details of the interface of the PHY 108 with the transmission media are not illustrated in the present disclosure, but can be found in the IEEE standards for this interface, IEEE Std 802 . . . 3ab-1999.

In the illustration of FIG. 1, there are illustrated four MAC/PHY paths, which allow for interfaces 102 to be connected together. There is provided a switch block 114 for interfacing the MACs 112 for each of the paths. This switch block is basically the interconnect layer that allows information to be transmitted between ports or to be shared between all ports. Other embodiments may use a network interface card (NIC) in conjunction with software on the system containing the NIC to perform the higher level functions.

Figure 2:
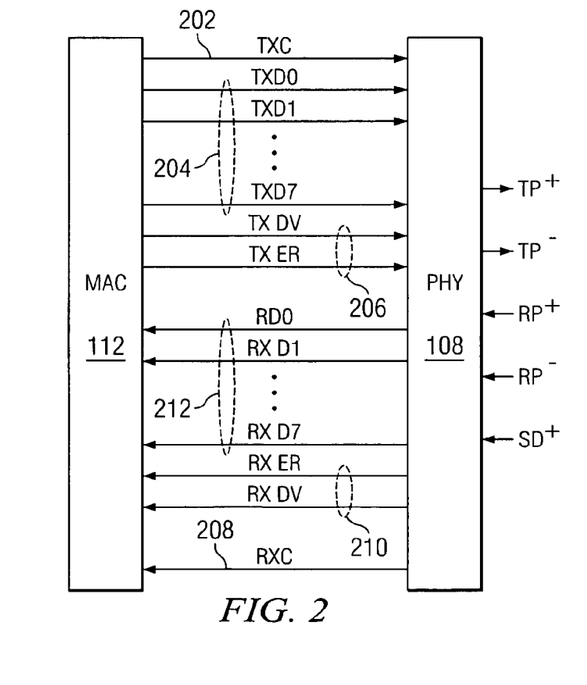
FIG. 2 illustrates a detail of the interface between the MAC and PHY devices.

Referring now to FIG. 2, there is illustrated a detailed diagram of the PHY 108 and MAC 112 interface for the GMII interface. Typically, the IEEE standard 802.3ab requires that data be transmitted on each rising clock edge of the transmit clock. To provide for a reduced pin count, the RGMII interface can be used that transmits data on the rising edge and the falling edge of the transmit clock. This is not illustrated in FIG. 2.

In the gigabit operation, clocks operate at 125 MHz and, for the 10/100 operation, the clocks will operate at 2.5 MHz and 25 MHz, respectively. The GMII interface utilizes ten data path signals for both transmit and receive data for both data and control. There is provided a transmit clock line 202 that carries the clock from the MAC 112 to the PHY 108. This clock rate will be at the rate of 125 MHz, 25 MHz or 2.5 MHz (clock rates for the TBI interface will be 62.5 Mhz. There are provided eight transmit data paths 204 with two transmit control bits on two data paths 206, one for a data valid transmit bit, TX_EN, and one for a transmit error signal, TX_ER. For a TBI format, the transfer data paths 204 and a transfer data paths 206 will comprise ten bits of data transmitted in this format. There is provided a receive block on a receive clock line 208 from the PHY 108 to the MAC 112 which operates at a rate of 125 MHz, 25 MHz or 2.5 MHz (62.5 Mhz for TBI). Two control data paths 210 provide the receive data valid signal, RX_DV, and the receive error control signal, RX_ER. There are provided eight receive data paths 212 for transmission of receive data from the PHY 108 to the MAC 112. For a TBI interface, the eight receive data paths 212 and the two control data paths 210 will be combined to provide ten data transfer paths for a ten bit data transfer (TBI operation).

Figure 3:
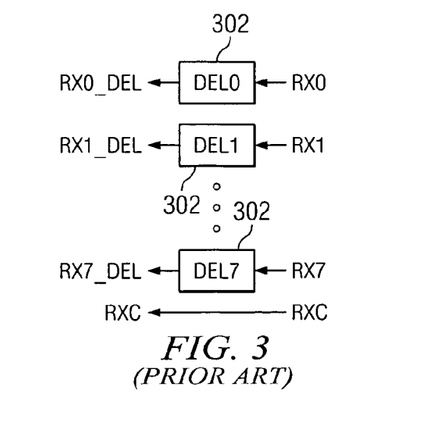
FIG. 3 illustrates a diagrammatic view of the prior art system for introducing a delay in the data path.
Figure 4:
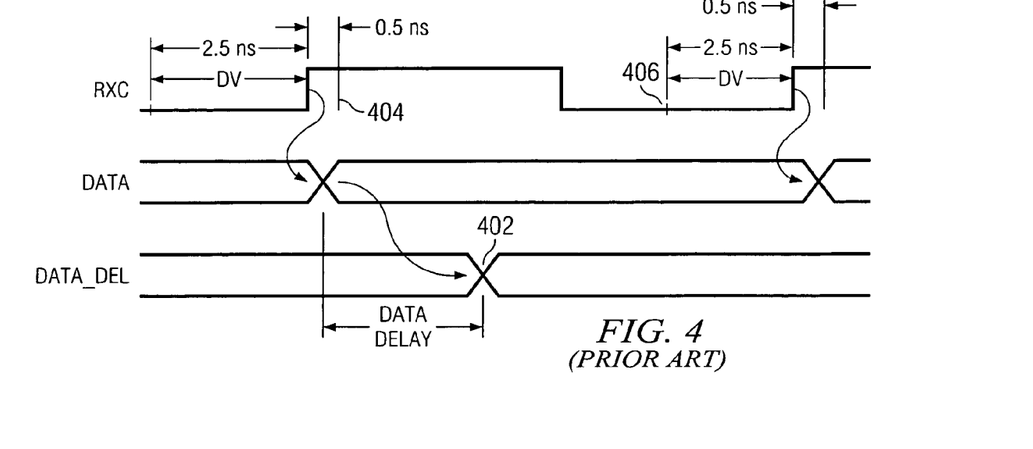
FIG. 4 illustrates a timing diagram of the prior art system of FIG. 3.

Referring now to FIG. 3, there is illustrated a block diagram for the prior art operation of delaying the data relative to the clock and FIG. 4 illustrates a timing diagram therefor. In FIG. 3, each receive data path, there being illustrated eight receive data paths for the GMII interface, are delayed by a separate delay block 302. The receive clock is not delayed in this embodiment. (Note that the two control data paths will also be delayed).

In FIG. 4, the receive clock is illustrated for one cycle thereof. The receive clock at the 125 MHz clock rate will be high for 4 ns and low for 4 ns. In the specification for receiving data, there is required that a set up time of 2.5 ns be provided prior to each rising edge of the receive clock and that there be a 0.5 ns hold time after the rising edge of the clock before any data is transmitted. The data in the prior art system is triggered from the rising edge of the receive clock on each cycle thereof to provide undelayed data for each data pat. This data is then delayed with the delay blocks 302 for each data path to provide valid data at a point 402. This is the point at which the data is actually valid. However, it should be noted that the clocking operation of the data from the rising edge of the receive clock usually involves some type of data flip-flop. This is clocked by the rising edge of the receive clock and will have an associated delay of approximately a nominal 500 ps. Each of the data paths will have a separate flip-flop associated therewith, such that there will be some timing variation between all of the data paths. This is due to the fact that each of the flip-flops will have a slightly different delay. A fixed delay is provided between the clocked data and the delayed data of nominal 2.0 ns with the delay blocks 302 for each data path. This is provided through a delay chain, the delay block 302, which will typically be realized with a plurality of series connected inverters. Each of these inverters has an associated delay which, due to the manufacturing tolerances, etc., will be different for each inverter such that the delay block 302 for each of the data paths will have some relative timing variation there between. As such, the prior art system requires substantial circuitry to provide each of the delay blocks 302 in addition to the inherent error that exists between each of the delay blocks, thus providing a less tightly controlled data transmission operation.

With the operation described herein above with respect to FIG. 4, the 2.5 ns setup time is the period of time prior to the rising edge of the receive clock in which data cannot change, i.e., it is required to be valid during that time. However, from a point 402 in each cycle to the next point 402 in the subsequent cycle of the receive clock, this is the point at which data is actually valid. However, this point 402 varies depending upon various errors, process, voltage and temperature conditions and the such. The desire is to place the data transition at point 402 within substantially the middle of the time between the end of the hold time, at a point 404, to beginning of the setup time at a point 406. For a 125 MHz clock, this is approximately a 5 ns window.

Figure 5:
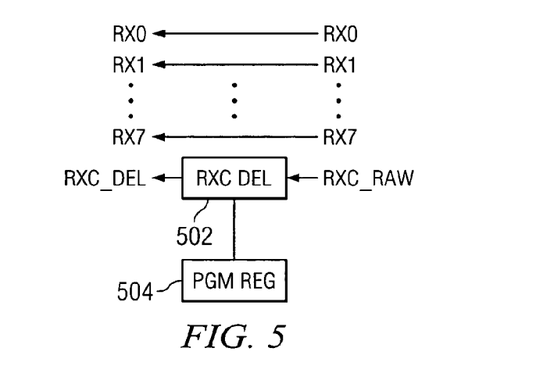
FIG. 5 illustrates a block diagram for the receive path of the present disclosure for introducing a programmable delay into the receive clock path.

Referring now to FIG. 5, there is illustrated a block diagram for the delay operation of the present disclosure. In this operation, only a single receive clock delay block 502 is provided which is programmable with a program register 504. Each of the receive data paths is a direct data path with no delay (other than delays associated with the connecting transmission lines between the PHY and the MAC). They are all clocked from the rising edge of the delayed receive clock.

Figure 6:
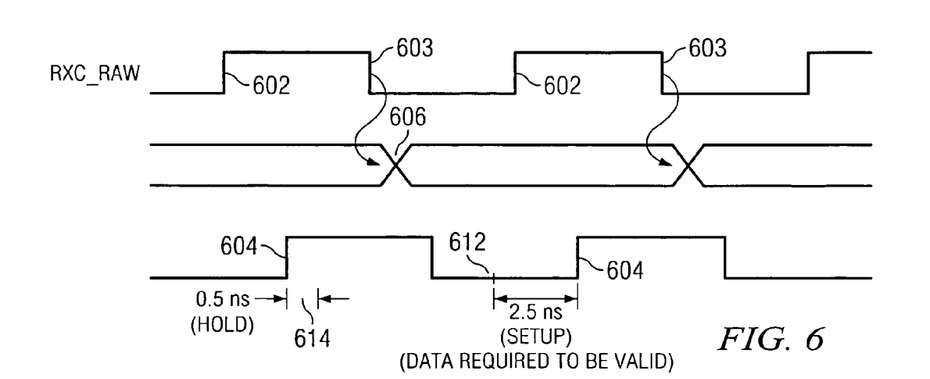
FIG. 6 illustrates a timing diagram for the embodiment of FIG. 5.

FIG. 6 illustrates a time diagram for the operation of FIG. 5. The raw receive clock, RXC_RAW, at a rising edge 602 is delayed by a programmable value from 1.5 ns to 2.5 ns in predetermined increments at a rising edge 604 on a delayed receive clock RXC_DEL. A falling edge 603 on the RXC_RAW is then utilized to trigger the data at a point 606 delayed by +0,5 ns, it being understood that the data represents all ten data/control paths for the GMII interface and the TBI interface. There will be basically one flip-flop delay of 500 ps for each of the data paths, the only error between the data paths being the error in the flip-flop associated with that transition. As such, the only delay that must be controlled is the single clock delay in delay block 502, which can be tightly controlled. Therefore, only a single delay block need be controlled and only the circuitry associated with that is required in association with the clock circuitry, as compared to requiring a delay block for each data path in the prior art systems. The system of the present disclosure will result in data actually being valid from point 606 to the point 606 in the subsequent receive clock cycle. However, data is only required to be valid between a point 612 at the beginning of the 2.5 ns setup time and prior to the end of the Hold time at a point 614.

Figure 7:
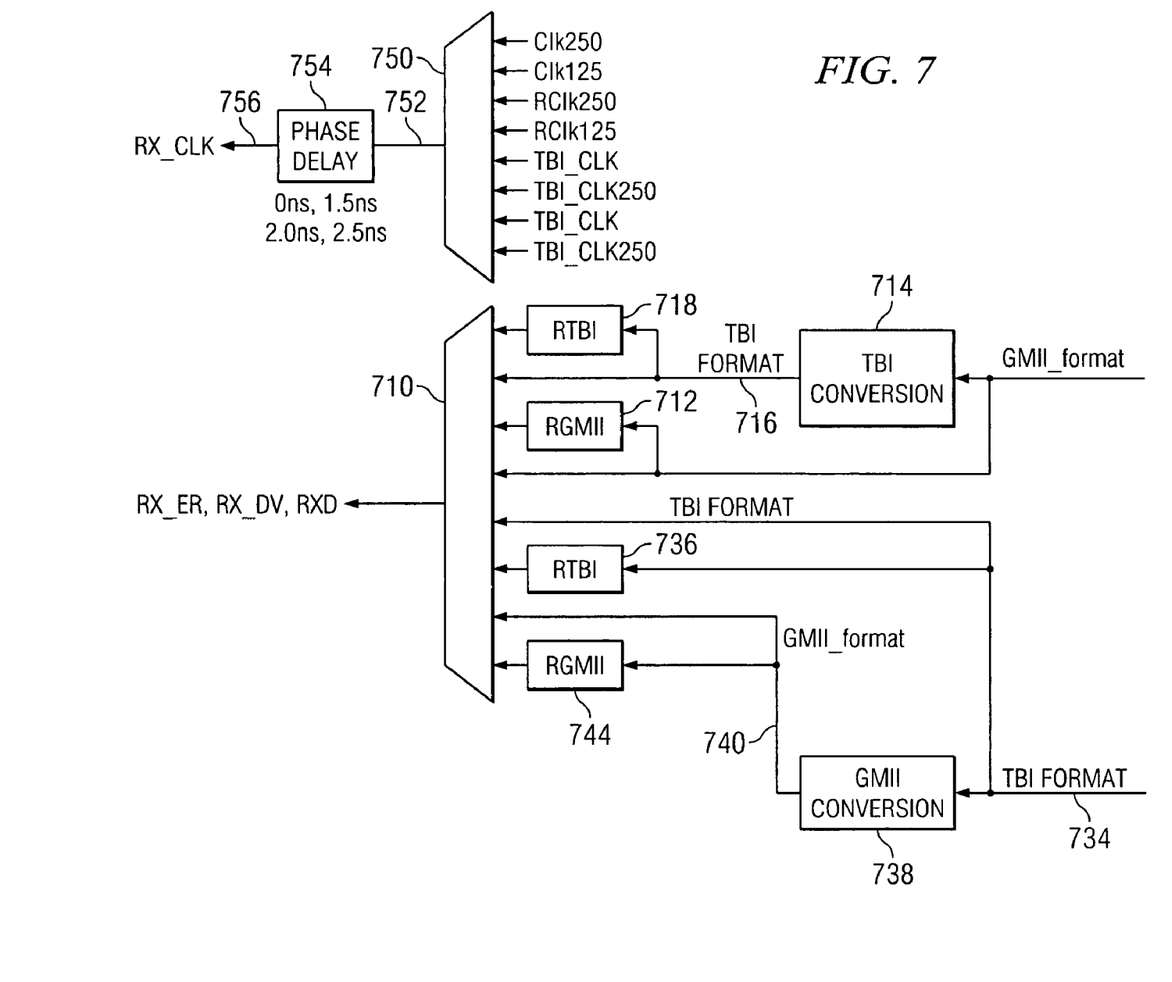
FIG. 7 illustrates an overall block diagram of the receive path of the present disclosure.

Referring now to FIG. 7, there is illustrated a block diagram of the receive path in the PHY 108 for transferring received data to the MAC 112. The GMII format is a format wherein there are eight bits of data and two control bits for data valid and data error. This dat/control information is input directly to the multiplexer 710. Additionally, the GMII format can be converted to RGMII data in a block 712 which is a double data rate version thereof which utilizes the 250 MHz clock. This was described in U.S. Pat. No. 6,604,206, which was incorporated herein by reference. The output of the block 712 can be provided to the multiplexer 710. The GMII data can also be processed with a TBI conversion block 714 to provide a ten bit data output on a ten bit bus 716. This is input to the multiplexer 710. There is also provided a reduced pin count TBI (RTBI) conversion block 718 that is operable to reduce the pin count with a double data rate version of the TBI format.

Data is received in a ten bit format or a TBI format on a ten bit data bus 734, which can be directly output in a TBI format to the multiplexer 710 or processed through an RTBI block 736 to provide an RTBI input to the multiplexer 710. The bus 734 is also input to a GMII conversion block 738 to provide data in the GMII format on a bus 740, this being a data bus and to control data bits for the error and data valid bits. This is input directly to the multiplexer 710 or to an RGMII conversion block 744 for conversion to an RGMII format for input to the multiplexer 710. Therefore, the multiplexer 710 outputs the receive data and the two receive control bits in either the reduced ten count format or the full format, either GMII or TBI. All of this operation is conventional.

The receive clock for RGMII operation is based on a 250 MHz internal clock with the output clock being a 125 MHz clock. Although not described in detail herein, data is output on the rising edge and the falling edge of the 125 MHz clock. For GMII, the internal clock is a 125 MHz clock with the output being a 125 MHz clock. For TBI operation, the internal clock is 125 MHz with the output clock being 62.5 MHz. A multiplexer 750 is provided that is operable to receive the 125 MHz internal clock and the 250 MHz internal clock, Clk125 and Clk250, respectively. Also, the recovered clock for either GMII or RGMII are output as RClk125 and RClk250, respectively. Also input to the multiplexer 250 are the TBI clock signal. This provides an output on a line 752 which is input to a phase delay block 754 to provide a delay of 0 ns, 1.5 ns, 2.0 ns or 2.5 ns, this being programmable. This provides the delay clock on a line 756.

Additionally, there is provided a multiplexer 758 for the transmit clock which is operable to receive at least the internally generated 125 MHz clock and the TBI clock. This is output on a line 760 for delay by a phase delay block 764 of a programmable value of 0 ns, 1.5 ns, 2.0 ns or 2.5 ns. This provides a delay clock on a line 766.

Figure 8:
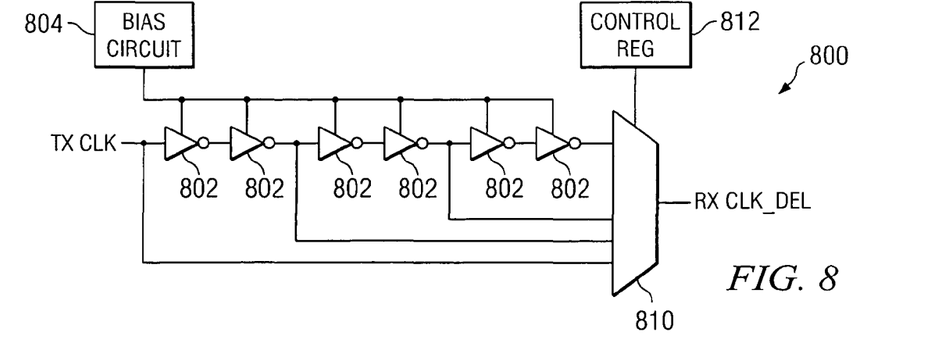
FIG. 8 illustrates a detailed block diagram of the delay block.

Referring now to FIG. 8, there is illustrated a detailed diagram of the delay block 502. The delay in the delay block 710 is facilitated with a plurality of series connected inverters. In the illustrated embodiment there are provided six inverters 802 connected in series. Each of the inverters 802 is referred to as a "current starved" inverter 802. Each of the inverters 802 receives bias from a bias circuit 804. The transmit clock is received on the input of the first of the inverters 802. The input to the first inverter 802 is input to a multiplexor 810, and the out put of the last inverter 802 is input to the multiplexor 810, the output thereof providing the delayed receive clock signal, RXCLK_DEL. Taps are provided along the inverter chain of inverters 802 to provide two additional inputs to the multiplexor 810. These will provide the delay 0.5, 1.5, 2.0 and 2,5 ns, the six inverters 802 actually utilizing more than six, the number determined by the delay increment desired. The multiplexor is programmed by a program register 812 that can be programmed by the user.

Figure 9:
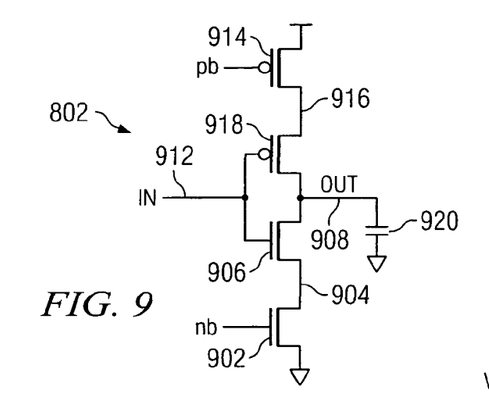
FIG. 9 illustrates a schematic diagram of the current starved inverter.

Referring now to FIG. 9, there is illustrated a schematic of the current starved inverter 802. A first n-channel transistor 902 has the source/drain path thereof connected between a node 904 and ground, the gate thereof connected to a bias signal nb. A second n-channel transistor 906 has the source/drain path thereof connected between an output node 908 and the node 904, the gate thereof connected to an input node 912. A first p-channel transistor 914 has the source/drain path thereof connected between $V_{dd}$ and a node 916, the gate thereof connected to the bias signal pb. A second p-channel transistor 918 has the source/drain path thereof connected between node 916 and the output node 908, the gate thereof connected to the input 912. The output 908 is illustrated as being interfaced with a capacitive load 920, the capacitive load 920 representing the input of the next inverter or circuitry that the delay clock is output to.

In operation, transistors 918 and 906 operate as a conventional inverter, such that node 912 going low turns on transistor 918, and node 912 going high turns on transistor 906. However, once either of the transistors 918 or 906 are turned on, the current there through is limited, which current is defined by the respective transistors 914 and 902, which are biased to provide a limited amount of current there through. This current through transistors 914 or 902 is utilized to charge the capacitor 920, the RC time constant associated therewith resulting in a finite rise time to the signal which will trigger the next gate when the threshold thereof is exceeded, resulting in a predefined delay. This delay can be adjusted by the amount of current that is provided by the bias, the bias signals pb and nb generated by the bias circuit 804.

Figure 10:
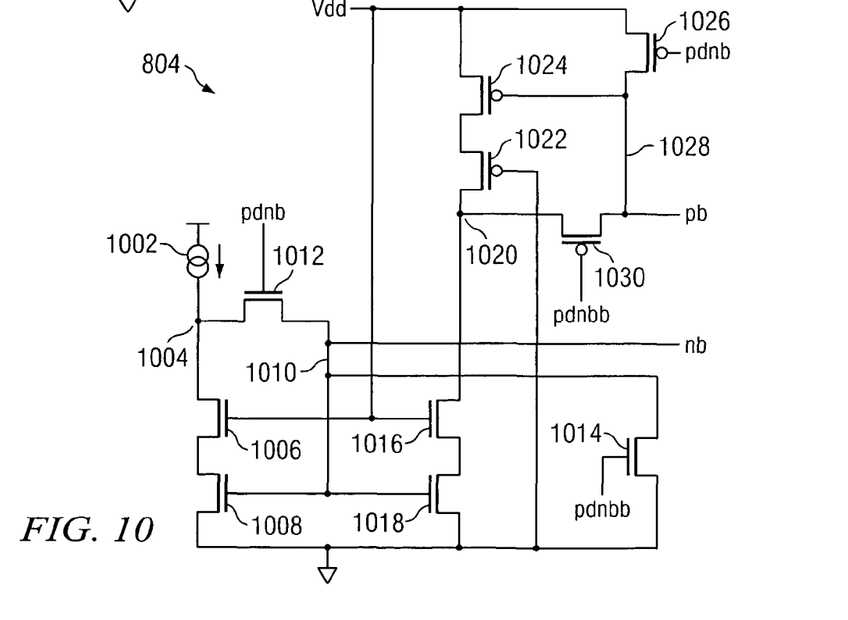
FIG. 10 illustrates a schematic diagram of the bias circuit for the current starved inverter.

Referring now to FIG. 10, there is illustrated a schematic diagram of the bias circuit 804. A reference current source 1002 is provided which is generated outside of the bias circuit 804 but on chip. This is a temperature and process invariant current with a value of 100 μa. This current is input to a node 1004, which is input to one side of the source/drain path of an n-channel transistor 1006, the other side thereof connected to one side of the source/drain path of an n-channel transistor 1008, which has the other side thereof connected to ground. The gate of transistor 1008 is connected to a node 1010, which comprises the nb bias signal. Node 1010 is connected through the source/drain path of an n-channel transistor 1012 to the node 1004, the gate of transistor 1012 connected to the power down signal pdnb. Node 1010 is also connected through the source/drain path of an n-channel transistor 1014 to ground, the gate thereof connected to the power down signal pdnbb of the inverse of the signal pdnb. Transistor 1006 has the gate thereof connected to $V_{dd}$.

The current from current source 1002 through transistors 1006 and 1008 is mirrored to another mirror leg. This leg is comprised of two series connected n-channel transistors 1016 and 1018, transistor 1016 having the source/drain path thereof connected between the node 1020 and one side of the source/drain path of transistor 1018, the other side of the source/drain path of transistor 1018 connected to ground. The gate of transistor 1018 is connected to node 1010 and the gate of transistor 1016 is connected to $V_{dd}$. Node 1020 is connected to one side of the source/drain path of a p-channel transistor 1022, the other side thereof connected to one side of the source/drain path of a p-channel transistor 1024, the other side of source/drain path of the transistor 1024 connected to $V_{dd}$. A p-channel transistor 1026 has the source/drain path thereof connected between the $V_{dd}$ and the gate of transistor 1024 on a node 1028, the gate of transistor 1026 connected to pdnb. Node 1028 comprises the bias output signal pb. Node 1028 is connected to the gate of transistor 1024 and the gate of transistor 1022 is connected to ground. A power down p-channel transistor 1030 has the source/drain path thereof connected between node 1020 and the node 1028 to provide the pb output signal, the gate of transistor 1030 connected to the power down signal pdnbd In general, this current source will provide a 100 µa current for both the pb node 1028 and the nb node 1010.

Although the preferred embodiment has been described in detail, it should be understood that various changes, substitutions and alterations can be made therein without departing from the spirit and scope of the invention as defined by the appended claims.

What is claimed is:

1. A method for transferring received data from a transmission medium on an input of a physical layer device of an Ethernet controller to an output associated with the physical layer device and to a media independent layer, the transferred data associated with transferred timing information from the physical layer device to the media independent layer, the method comprising:
   generating a receive clock;
   synchronizing data transitions of each of a plurality of bits in the received data to at least one edge of the generated receive clock to provide synchronized receive data in the physical layer device;
   transmitting the synchronized plurality of bits of receive data to the media independent layer over a plurality of corresponding transmit paths from the physical layer device;
   receiving a programmable clock delay;
   generating a delayed receive clock in the physical layer device by delaying the receive clock by the programmable clock delay;
   wherein the data transitions in the synchronized plurality of bits of receive data are positioned relative to a rising edge of the generated delayed receive clock at a predetermined position therein following the rising edge thereof; and
   transmitting the generated delayed receive clock to the media independent layer along with the synchronized plurality of bits of receive data.

2. The method of claim 1 wherein the synchronizing the data transitions of each of the plurality of data bits in the received data comprises synchronizing the data transitions of each of the plurality of data bits in the received data to a falling edge of the receive clock so as to provide a phase shift of the synchronized receive data from the rising edge of the receive clock by a predetermined phase shift between the rising and falling edges of one cycle of the receive clock.

3. The method of claim 2 wherein the receive clock is substantially symmetrical such that the phase shift is approximately a 180 degree phase shift.

4. The method of claim 1 wherein the transmitting the synchronized plurality of bits of receive data comprises transmitting each of the synchronized bits of receive data on a separate transmit path to the media independent layer.

5. The method of claim 1, wherein the delaying the receive clock by the programmable clock delay comprises delaying the receive clock by a predetermined amount of phase delay relative to the rising edge of the receive clock.

6. The method of claim 1 wherein the delaying the receive clock by the programmable clock delay comprises delaying the receive clock by a predetermined phase shift from the rising edge of the receive clock to provide the delayed receive clock.

7. The method of claim 6, wherein the data transitions of the synchronized receive data occur after the rising edge of the delayed receive clock.

8. The method of claim 7 wherein a predetermined amount of hold time is required after the rising edge of the delayed receive clock and prior to the generation of the synchronized data transition in the synchronized receive data.

9. The method of claim 7 wherein the data transition for the synchronized receive data is prohibited from occurring prior to a predetermined amount of time for the rising edge of the delayed receive clock.

10. The method of claim 9, wherein the predetermined amount of time prior to the rising edge of the delayed receive clock requires that the data be valid during that time.

11. The method of claim 1, wherein the delaying the receive clock comprises:
    providing a plurality of inverters;
    arranging the inverters such that they are disposed in a chain with the output of ones of the inverters driving inputs of others of the inverters; and
    selectively selecting outputs of select ones of the inverters in the chain to provide increments of delay.

12. The method of claim 11 wherein the inverters are current starved inverters.

13. The method of claim 1, wherein the generating the receive clock is operable to recover the clock information from the received data.

14. An output clock adjustment circuit for a digital I/O for transferring data received from a transmission medium on an input of a physical layer device of an Ethernet controller to an output associated with the physical layer device and to a media independent layer, the transferred data associated with transferred timing information from the physical layer device to the media independent layer, comprising:
    a receive clock generator for generating a receive clock;
    a timing circuit for synchronizing data transitions in each of a plurality of bits of the received data to at least one edge of said receive clock to provide synchronized plurality of bits of receive data;
    a transmitter for transmitting the synchronized plurality of bits of receive data to the media independent layer over a plurality of transmit paths;

a delay circuit in the physical layer device for receiving a programmable clock delay and for delaying said receive clock by the programmable clock delay to generate a delayed receive clock;

wherein the data transitions in the synchronized plurality of bits of receive data are positioned relative to a rising edge of the generated delayed receive clock at a predetermined position therein following the rising edge thereof; and said transmitter for transmitting the generated delayed receive clock to the media independent layer along with the synchronized plurality of bits of receive data received from the transmission medium.

15. The output clock adjustment circuit of claim 14 wherein said timing circuit is operable to synchronize the data transitions in the plurality of bits of received data to a falling edge of the receive clock so as to provide a phase shift of the synchronized plurality of bits of receive data from the rising edge of said receive clock by a predetermined phase shift between the rising and falling edges of one cycle of said receive clock.

16. The output clock adjustment circuit of claim 15 wherein said receive clock is substantially symmetrical such that the phase shift is approximately a 180 degree phase shift.

17. The output clock adjustment circuit of claim 14 wherein said transmitter transmits each of the synchronized bits of receive data on a separate transmit path to the media independent layer.

18. The output clock adjustment circuit of claim 14, wherein said delay circuit is operable to delay said receive clock by a predetermined amount of phase delay relative to the rising edge of said receive clock.

19. The output clock adjustment circuit of claim 14 wherein said delay circuit is operable to delay said receive clock by a predetermined phase shift from the rising edge of said receive clock to provide said delayed receive clock.

20. The output clock adjustment circuit of claim 19, wherein the data transitions of the synchronized receive data occur after the rising edge of said delayed receive clock.

21. The output clock adjustment circuit of claim 20, wherein a predetermined amount of hold time is required after the rising edge of said delayed receive clock and prior to the generation of the synchronized data transition in the synchronized receive data.

22. The output clock adjustment circuit of claim 20, wherein the data transition for the synchronized receive data is prohibited by said timing circuit from occurring prior to a predetermined amount of time for the rising edge of said delayed receive clock.

23. The output clock adjustment circuit of claim 22, wherein the predetermined amount of time prior to the rising edge of said delayed receive clock requires that the data be valid during that time.

24. The output clock adjustment circuit of claim 14, wherein said delay circuit comprises:

a plurality of inverters;

said inverters arranged such that said inverters are disposed in a chain with the output of ones of said inverters driving inputs of others of said inverters; and a switching circuit for selecting outputs of select ones of said inverters in the chain to provide increments of delay.

25. The output clock adjustment circuit of claim 24 wherein said inverters are current starved inverters.

26. The output clock adjustment circuit of claim 14, wherein said clock generator is operable to recover the clock information from the received data.

* * * * *